US008604670B2

(12) United States Patent
Mahameed et al.

(10) Patent No.: US 8,604,670 B2
(45) Date of Patent: Dec. 10, 2013

(54) PIEZOELECTRIC ALN RF MEM SWITCHES MONOLITHICALLY INTEGRATED WITH ALN CONTOUR-MODE RESONATORS

(75) Inventors: Rashed Mahameed, Umm Al-Fahem (IL); Nipun Sinha, Philadelphia, PA (US); Gianluca Piazza, Philadelphia, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 245 days.

(21) Appl. No.: 12/994,301

(22) PCT Filed: Jun. 1, 2009

(86) PCT No.: PCT/US2009/045815
§ 371 (c)(1),
(2), (4) Date: Mar. 22, 2011

(87) PCT Pub. No.: WO2009/158141
PCT Pub. Date: Dec. 30, 2009

(65) Prior Publication Data
US 2011/0181150 A1    Jul. 28, 2011

Related U.S. Application Data

(60) Provisional application No. 61/057,538, filed on May 30, 2008.

(51) Int. Cl.
*H01L 41/09* (2006.01)
(52) U.S. Cl.
USPC .............................. 310/330; 310/331; 310/332

(58) Field of Classification Search
USPC ........................................... 310/328, 330–332
See application file for complete search history.

(56) References Cited

U.S. PATENT DOCUMENTS

| 4,093,883 | A | * | 6/1978 | Yamamoto | 310/317 |
| 4,403,166 | A | * | 9/1983 | Tanaka et al. | 310/332 |
| 4,610,475 | A | * | 9/1986 | Heiserman | 294/86.4 |
| 4,739,664 | A | * | 4/1988 | Hetrick | 73/704 |
| 5,966,066 | A | | 10/1999 | Mehregany et al. | |
| 6,473,361 | B1 | | 10/2002 | Chen et al. | |
| 6,700,309 | B2 | | 3/2004 | Dausch et al. | |
| 7,197,225 | B2 | | 3/2007 | Romo et al. | |
| 7,372,191 | B2 | * | 5/2008 | Ohmori et al. | 310/330 |
| 2006/0133724 | A1 | * | 6/2006 | Huang et al. | 385/18 |
| 2007/0228887 | A1 | * | 10/2007 | Nishigaki et al. | 310/332 |

OTHER PUBLICATIONS

International Search Report for PCT International Application No. PCT/US2009/045815 mailed Aug. 12, 2009.

* cited by examiner

*Primary Examiner* — Thomas Dougherty
(74) *Attorney, Agent, or Firm* — RatnerPrestia

(57) ABSTRACT

Piezoelectric switches and methods of forming piezoelectric switches. The piezoelectric switch includes first and second cantilever beam actuators. The second cantilever beam actuator has a projection that overlaps the first cantilever beam actuator in a contact region. The projection is mechanically separated from the first cantilever beam actuator by a nanogap such that the first and second cantilever beam actuators are electrically isolated from each other. Each of the first and second cantilever beam actuators includes a piezoelectric actuation layer.

26 Claims, 16 Drawing Sheets

US 8,604,670 B2

PIEZOELECTRIC ALN RF MEM SWITCHES MONOLITHICALLY INTEGRATED WITH ALN CONTOUR-MODE RESONATORS

CROSS REFERENCE TO RELATED APPLICATIONS

This application is a U.S. National Phase Application of PCT International Application No. PCT/US2009/045815 filed Jun. 1, 2009 which is related to and claims the benefit of U.S. Provisional Application No. 61/057,538 entitled PIEZOELECTRIC ALN RF MEM SWITCHES MONOLITHICALLY INTEGRATED WITH ALN CONTOUR-MODE RESONATORS filed on May 30, 2008, the contents of all of which are incorporated herein by reference.

STATEMENT REGARDING FEDERALLY SPONSORED RESEARCH

The present invention was supported in part by a grant from Defense Advanced Research Projects Agency (DARPA) (Grant No. W911QX-06-C-0097). The United States Government has certain rights to the invention.

FIELD OF THE INVENTION

The present invention relates to piezoelectric devices. In particular, the present invention relates to piezoelectric switches and methods of forming piezoelectric switches having dual-beam actuators.

BACKGROUND OF THE INVENTION

Electronic systems typically use switches to route signals. A common type of switching device includes a micro-electromechanical (MEM) switch. Generally, MEM switches include a conductive beam that is coupled to one signal line, while being electrically and mechanically isolated from another signal line. When deflected downward, the conductive beam is capable of coming into mechanical and electrical contact with the other signal line, thus providing an electrical signal path between the two signal lines. Typically, electrostatic actuation is used to deflect the conductive beam. A first electrostatic plate is formed on the conductive beam and a second electrostatic plate is formed below the conductive beam. A voltage is applied to the second electrostatic plate, causing the first electrostatic plate, and thus the conductive beam, to be pulled downward. Electrostatically activated switches, however, typically require a high actuation voltage (for example, greater than about 50 V). Electrostatically activated switches may also suffer from actuation-induced non-linearity in their switch response.

Piezoelectric transducers, in general, convert electrical signals into mechanical vibrations or vice versa. Piezoelectric transducers typically utilize a piezoelectric film where electrical signals or mechanical vibrations induce a morphological change of the piezoelectric film (i.e., due to voltage application or due to a pressure applied to piezoelectric film). Piezoelectric transducers are generally used to actuate/sense different frequencies. Piezoelectric transducers may function as a resonator to provide a maximum response when operated at its resonance frequency.

One typical piezoelectric transducer includes a surface acoustic wave (SAW) transducer that, when excited, produces mechanical vibrations along the surface of the piezoelectric film. SAW piezoelectric transducers typically do not scale well to radio frequency (RF) applications due to a need for submicrometer lithography and decreasing power handling capabilities. Another type of piezoelectric transducer includes a contour-mode (CM) piezoelectric transducer that, when excited, produces mechanical vibrations throughout the piezoelectric film and where the fundamental frequency is defined by the in-plane dimensions of the piezoelectric film.

SUMMARY OF THE INVENTION

The present invention relates to piezoelectric switches and methods of forming piezoelectric switches. The piezoelectric switch includes a first and second cantilever beam actuators. The second cantilever beam actuator has a projection that overlaps the first cantilever beam actuator in a contact region. The projection is mechanically separated from the first cantilever beam actuator by a nanogap such that the first and second cantilever beam actuators are electrically isolated from each other. Each of the first and second cantilever beam actuators include a piezoelectric actuation layer.

BRIEF DESCRIPTION OF THE DRAWINGS

The invention may be understood from the following detailed description when read in connection with the accompanying drawings. It is emphasized that, according to common practice, various features/elements of the drawings may not be drawn to scale. On the contrary, the dimensions of the various features/elements may be arbitrarily expanded or reduced for clarity. Moreover, in the drawings, common numerical references are used to represent like features/elements. Included in the drawings are the following figures.

DETAILED DESCRIPTION OF THE INVENTION

Aspects of the present invention include a piezoelectric switch and methods of forming a piezoelectric switch. The piezoelectric switch includes first and second cantilever beam actuators that each include a piezoelectric actuation layer. The second cantilever beam actuator includes a projection that overlaps the first cantilever beam actuator in a contact region. The projection is mechanically separated from the first cantilever beam actuator by a nanogap such that the first and second cantilever beam actuators are electrically isolated from each other. Another aspect of the present invention is the method of forming a semiconductor chip including CM piezoelectric transducers that are monolithically integrated with dual-beam piezoelectric switches.

Figure 1A:
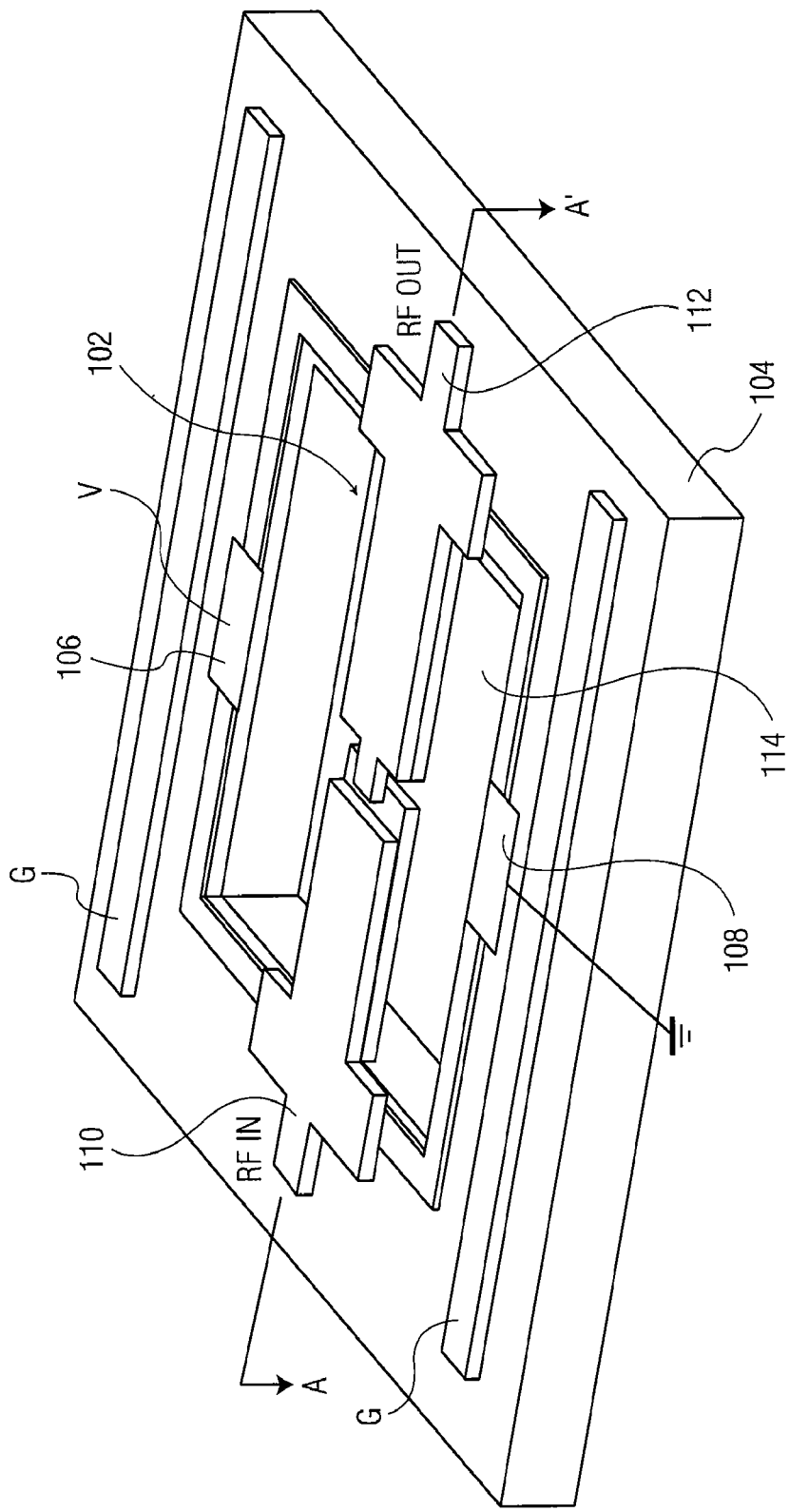
FIG. 1A is a perspective diagram of an exemplary piezoelectric switch, according to an embodiment of the present invention.
Figure 1B:
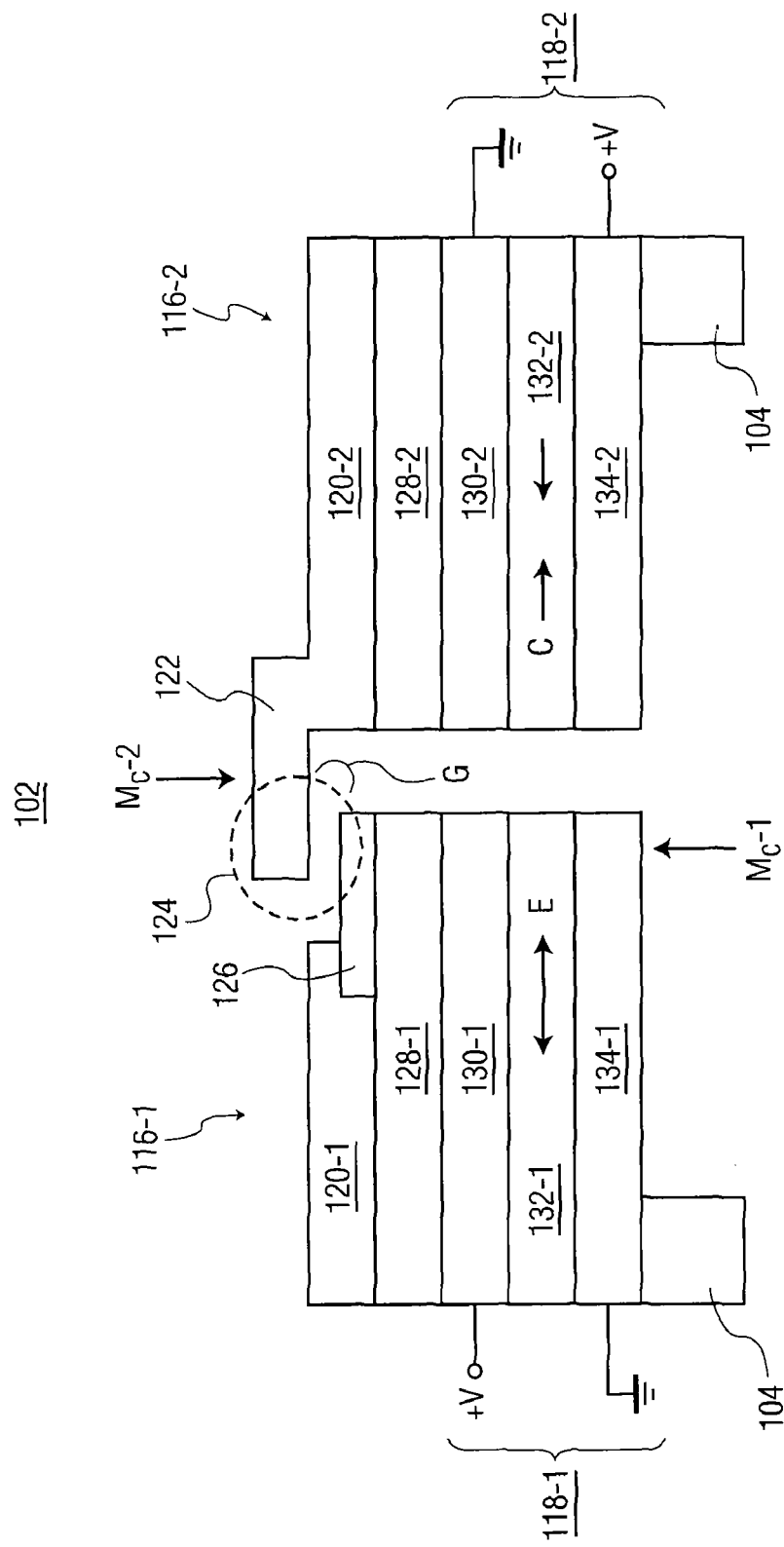
FIG. 1B is a cross-section diagram of the piezoelectric switch shown in FIG. 1A along lines A, A', illustrating closure of the piezoelectric switch.
Figure 1C:
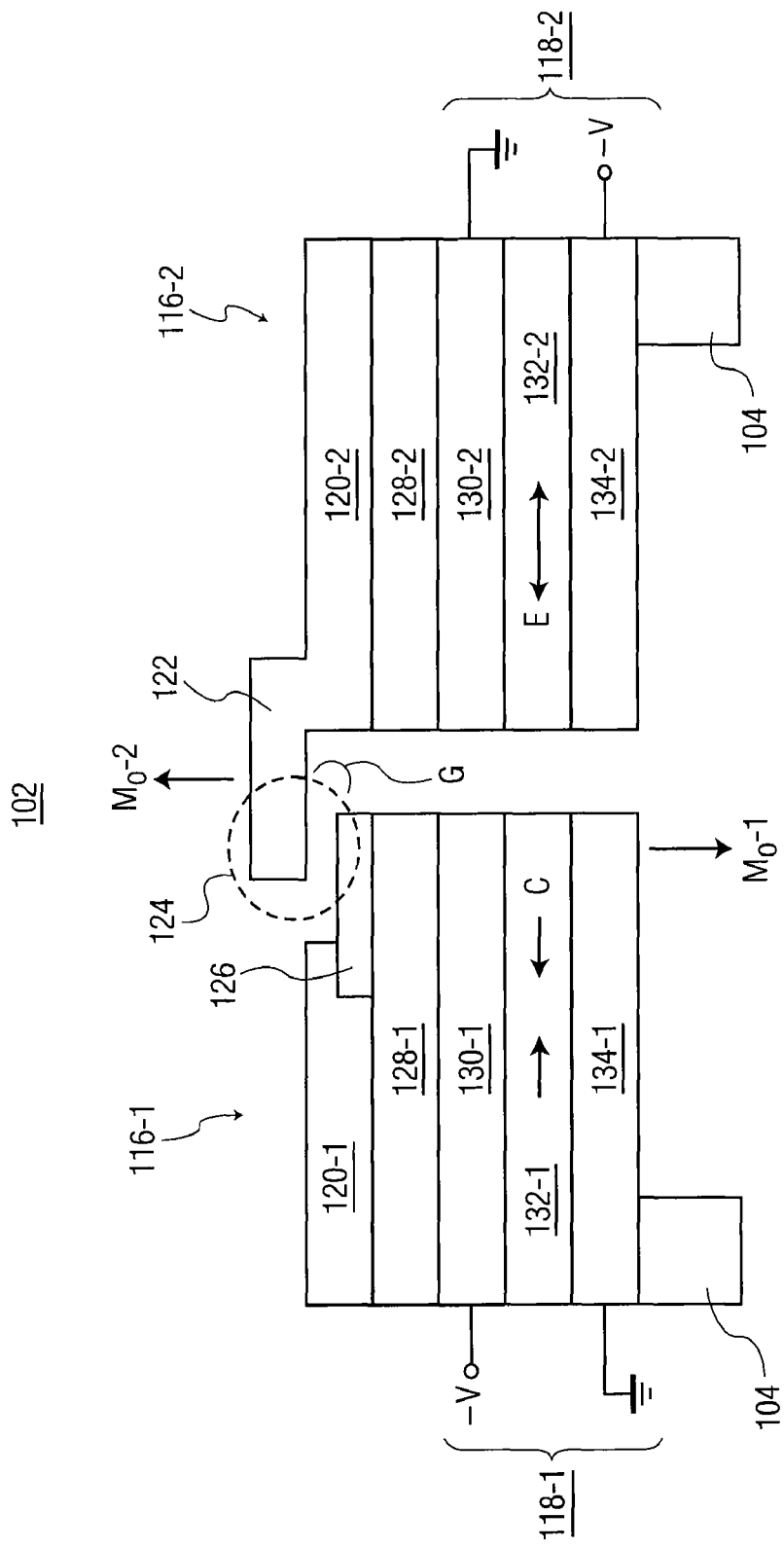
FIG. 1C is a cross-section diagram of the piezoelectric switch shown in FIG. 1A along lines A, A', illustrating opening of the piezoelectric switch.

Referring to FIGS. 1A, 1B and 1C, exemplary piezoelectric switch 102 is shown coupled to substrate 104. In particular, FIG. 1A is a perspective diagram of piezoelectric switch 102 coupled to substrate 104; FIG. 1B is a cross-section of piezoelectric device 102 and substrate 104, along lines A, A', illustrating closure of piezoelectric switch 102; and FIG. 1C is a cross-section diagram of piezoelectric device 102 and substrate 104 along lines A, A', illustrating opening of piezoelectric switch 102.

Piezoelectric switch 102 includes respective first and second cantilever beam actuators 116-1, 116-2 (i.e. representing dual-beam actuators). Each cantilever beam actuator 116 includes conductor layer 120 disposed above piezoelectric actuation layer 118. In addition, each cantilever beam actuator 116 includes isolation layer 128 between conductor layer 120 and piezoelectric actuation layer 118. Isolation layer 128 may be used to isolate an actuation signal V (provided to piezoelectric actuation layer 118) from an RF signal (passed through conductor layer 120).

Each cantilever beam actuator 116 is coupled to substrate 104 and suspended from substrate 104 by etched portion 114. As shown in FIG. 1A, control voltage contact 106 and ground contact 108 are coupled to piezoelectric actuation layer 118. Although one control voltage contact 106 is shown in FIG. 1A, it is understood that different control voltage contacts 106 may be coupled to piezoelectric actuation layers 118-1, 118-2. Accordingly, a common actuation signal (i.e. with one control voltage contact 106) may control actuation of both cantilever beam actuators 116-1, 116-2. Alternatively, different actuation signals may be used to separately control actuation of cantilever beam actuators 116-1, 116-2.

RF input signal contact 110 is coupled to contact layer 120-1 of first cantilever beam actuator 116-1. RF output signal contact 112 is coupled to conductor layer 120-2 of second cantilever beam actuator 116-2. Although FIG. 1A illustrates RF input signal contact 110 coupled to conductor layer 120-1 and RF output signal contact 112 connected to conductor layer 120-2, it is understood that RF input signal contact 110 may be coupled to conductor layer 120-2 and RF output signal contact 112 may be coupled to conductor 120-1.

As shown in FIG. 1B, conductor layer 120-2 of second cantilever beam actuator 116-2 includes projection 122 that overlap first cantilever beam actuator 116-1 in contact region 124. First cantilever beam actuator 116-1 is separated from second cantilever beam actuator 116-2 by nanogap (G). In an exemplary embodiment, nanogap G is about 200 nm to about 300 nm. The nanogap can also be made smaller or larger and ranges between about 100 to about 3,000 nm. Nanogap G provides electrical isolation between first and second cantilever beam actuators 116-1, 116-2. In addition to conductor layer 120-1, first cantilever beam actuator 116-1 includes further conductor layer 126 in the vicinity of the contact region 124. Accordingly, when piezoelectric switch 102 is closed, projection 122 is in contact with further conductor layer 126 (where further conductor layer 126 is also in contact with conductor layer 120-1).

Each piezoelectric actuation layer 118 includes piezoelectric film 132, as well as respective first and second electrodes 130, 134 disposed on opposite of surfaces of piezoelectric film 132. In an exemplary embodiment, each piezoelectric actuation layer 118 may be formed from a unimorph actuator. In another embodiment, each piezoelectric actuation layer 118 may be formed from a bimorph actuator.

In an exemplary embodiment, isolation layer 128 and piezoelectric film 132 are formed from a same piezoelectric material. Any suitable piezoelectric material may be used for isolation layer 128 and piezoelectric film 132, for example, aluminum nitride, zinc oxide, lead zirconate titanate (PZT), gallium arsenide, aluminum gallium arsenide or any combination thereof.

In an exemplary embodiment, first and second electrodes 130, 134 and further conductor layer 126 are each formed from platinum. It is understood that any metallic material may be used for first and second electrodes 130, 134 and further conductor layer 126, provided that the metallic material satisfies any desired material compatibility with piezoelectric film 132 or isolation layer 128 (e.g., adhesion, formation of deleterious phases with piezoelectric film 132/isolation layer 128, or a quality of piezoelectric film 132/isolation layer 128 that may be deposited thereto). Examples of materials for electrodes 130, 134, and further conductor layer 126 include, but are not limited to, gold, platinum, iridium, ruthenium, molybdenum, titanium, rhodium, tungsten, copper or any suitable type of alloy formed by a combination thereof.

Although in an exemplary embodiment, conductor layer 120 is formed from gold, it is understood that conductor layer 120 maybe formed from any suitable conductive metallic material such as copper, chromium or aluminum. In general, metallic materials that are highly conductive are desired.

Although FIG. 1A illustrates first cantilever beam actuator 116-1 collinear with second cantilever beam actuator 116-2, it is contemplated that second cantilever beam actuator 116-2 may be positioned at an angle with respect to first cantilever actuator beam 116-1. Furthermore, although one conductor layer 120 and one piezoelectric actuation layer 118 is illustrated for each cantilever beam actuator 116, it is understood that conductor layer 120 may include multiple conductor layers and that piezoelectric actuation layer 118 may include multiple piezoelectric actuation layers. Furthermore, it is understood that more than one projection 122 and more than nanogap G may be provided on conductor layer 120-2.

Referring to FIG. 1B closure of piezoelectric switch 102 is explained. To close piezoelectric switch 102, a positive voltage (+V) is applied to first electrode 130-1 of first cantilever beam actuator 116-1 on and positive voltage +V is simultaneously applied to second electrode 134-2 and of second cantilever beam actuator 116-2. In addition, second electrode 134-1 and first electrode 130-2 are coupled to ground.

Application of the positive voltage to first cantilever beam actuator 116-1 causes piezoelectric film 132-1 to expand (illustrated by double headed arrow E). Expansion of piezoelectric film 132-1 causes cantilever beam actuator 116-1 to bend upward, as shown by arrow $M_c$-1. Application of the positive voltage to second cantilever beam actuator 116-2 causes piezoelectric film 132-2 to contract (illustrated by double arrows C). Contraction of piezoelectric film 132-2 causes second cantilever beam actuator 116-2 to bend in a downward direction, as shown by arrow $M_c$-2. Accordingly, because first cantilever actuator beam 116-1 bends upward ($M_c$-1) and second cantilever beam actuator 116-2 bends downward ($M_c$-2), projection 122 contacts further conductor layer 126 and piezoelectric switch 102 is closed. Accordingly, when piezoelectric switch 102 is closed, an RF signal may be passed from input signal contact 110 to output signal contact 112 (FIG. 1A).

Referring to FIG. 1C, opening of piezoelectric switch 102 is explained. To close piezoelectric switch 102, a negative voltage (−V) is applied to first electrode 130-1 of first cantilever beam actuator 116-1 on and negative voltage −V is simultaneously applied to second electrode 134-2 and of second cantilever beam actuator 116-2. In addition, second electrode 134-1 and first electrode 130-2 are coupled to ground.

Application of the negative voltage to first cantilever beam actuator 116-1 causes piezoelectric film 132-1 to contract (illustrated by double arrows C). Contraction of piezoelectric film 132-1 causes cantilever beam actuator 116-1 to bend downward, as shown by arrow $M_o$-1. Application of the negative voltage to second cantilever beam actuator 116-2 causes piezoelectric film 132-2 to expand (illustrated by double headed arrow E). Expansion of piezoelectric film 132-2 causes second cantilever beam actuator 116-2 to bend in an upward direction, as shown by arrow $M_o$-2. Accordingly, because first cantilever actuator beam 116-1 bends downward ($M_o$-1) and second cantilever beam actuator 116-2 bends upward ($M_o$-2), projection 122 is electrically isolated from further conductor layer 126 and piezoelectric switch 102 is opened. Accordingly, when piezoelectric switch 102 is opened, an RF signal may be blocked between input signal contact 110 and output signal contact 112 (FIG. 1A).

Figure 2A:
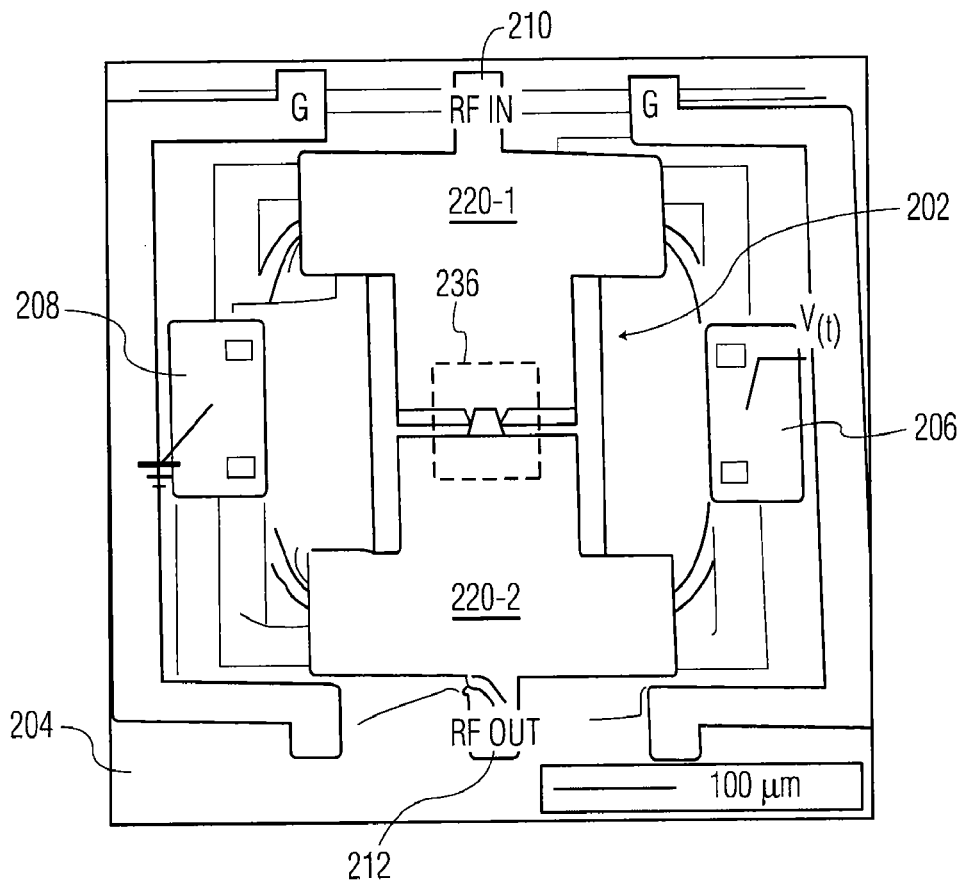
FIG. 2A is an overhead diagram of an exemplary piezoelectric switch, according to another embodiment of the present invention.
Figure 2B:
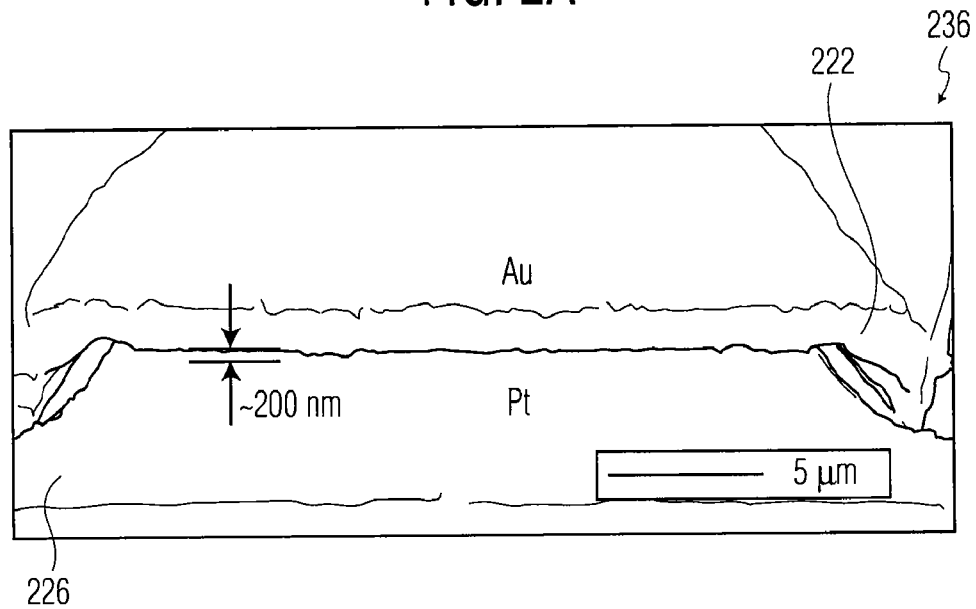
FIG. 2B is a cross-section diagram of a portion of the piezoelectric switch shown in FIG. 2A.

Referring to FIGS. 2A and 2B, piezoelectric switch 202 coupled to substrate 204 is shown. In particular, FIG. 2A is an overhead view diagram of piezoelectric device 202 and substrate 204; and FIG. 1B is a cross-section of a portion of piezoelectric switch 202 in region 236.

Control voltage contact 206 and ground contact 208 are coupled to piezoelectric switch 202 via a piezoelectric actuation layer (not shown), similar to piezoelectric switch 102 (FIG. 1A). Input signal contact 210 and output signal 212 are coupled to respective conductor layers 220-1, 220-2 of piezoelectric 202. As shown in FIG. 2B, piezoelectric switch 202 includes a gold projection 222 and a platinum further conductor layer 226 that are separated by a nanogap of about 200-300 nm when piezoelectric switch 202 is not actuated or open.

Figure 3A:
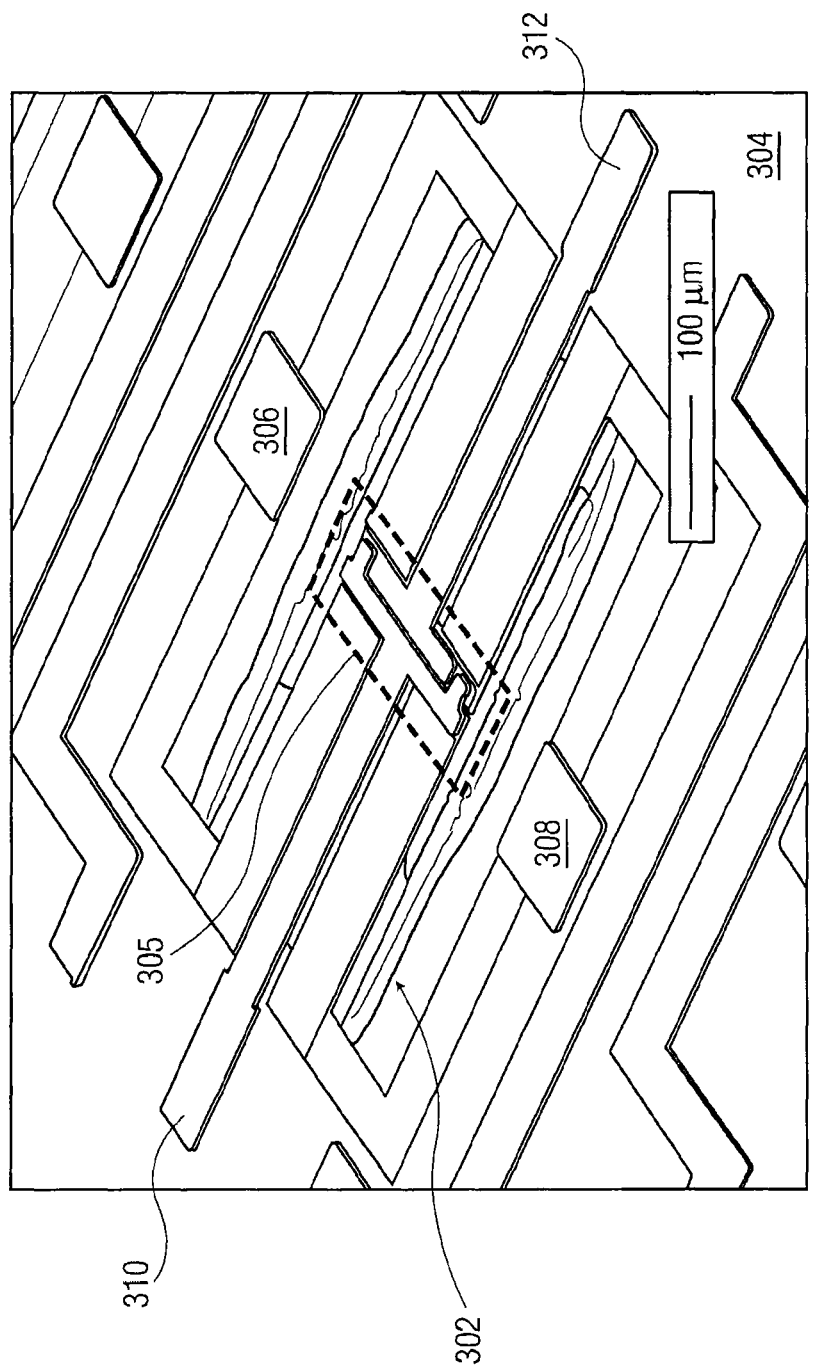
FIG. 3A is a perspective diagram of an exemplary piezoelectric switch, according to a further embodiment of the present invention.
Figure 3B:
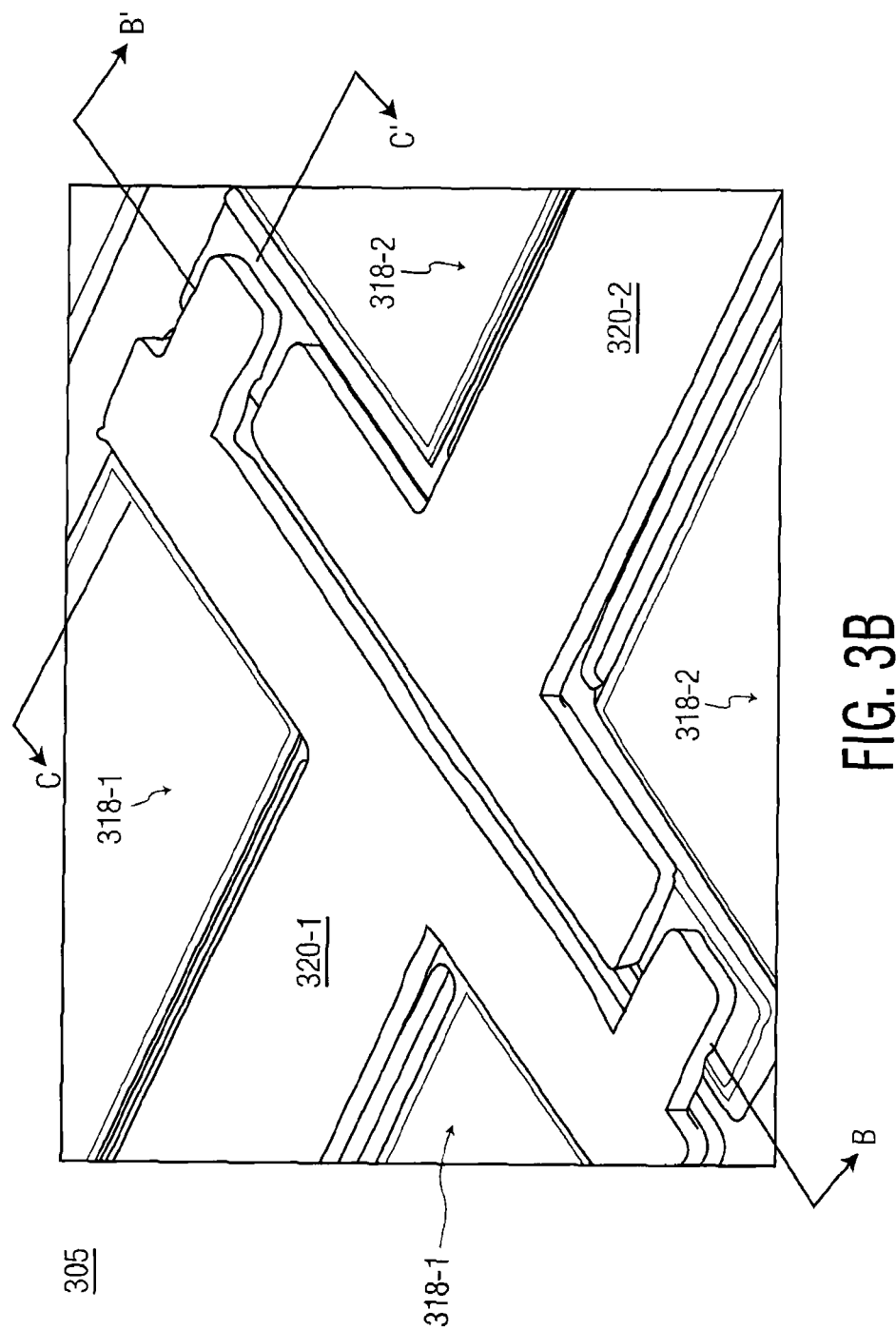
FIG. 3B is a perspective diagram of a portion of the piezoelectric switch shown in FIG. 3A.
Figure 3C:
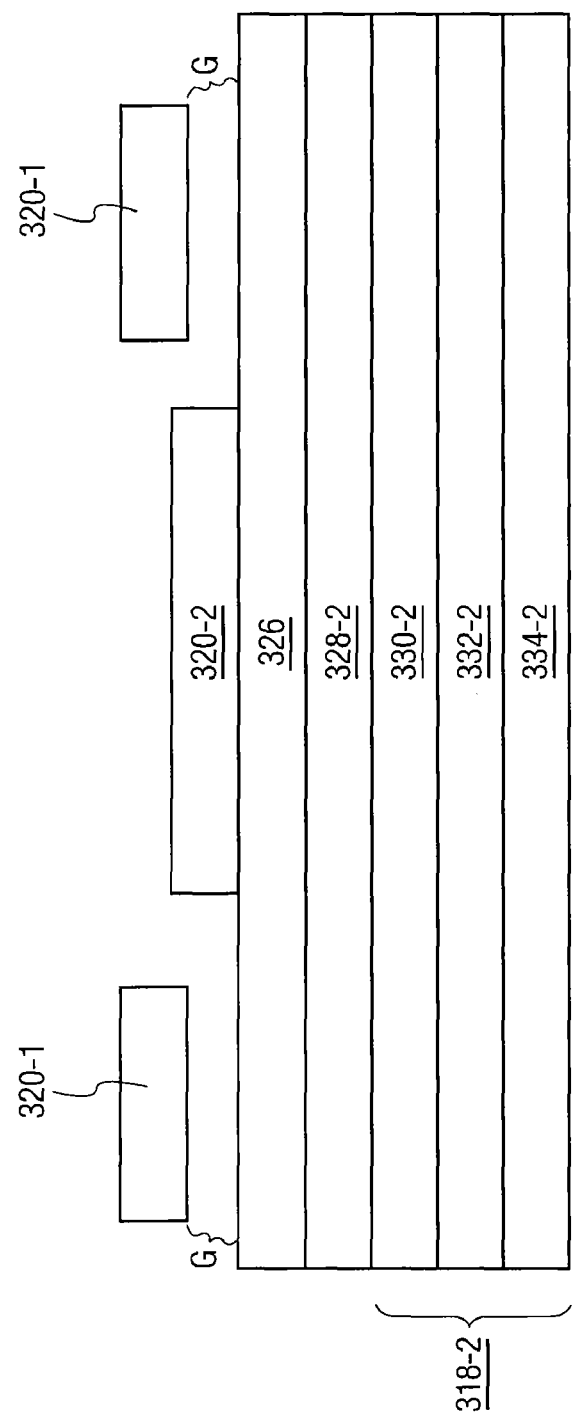
FIG. 3C is a cross-section diagram of the portion of the piezoelectric switch shown in FIG. 3B, along lines B, B'.
Figure 3D:
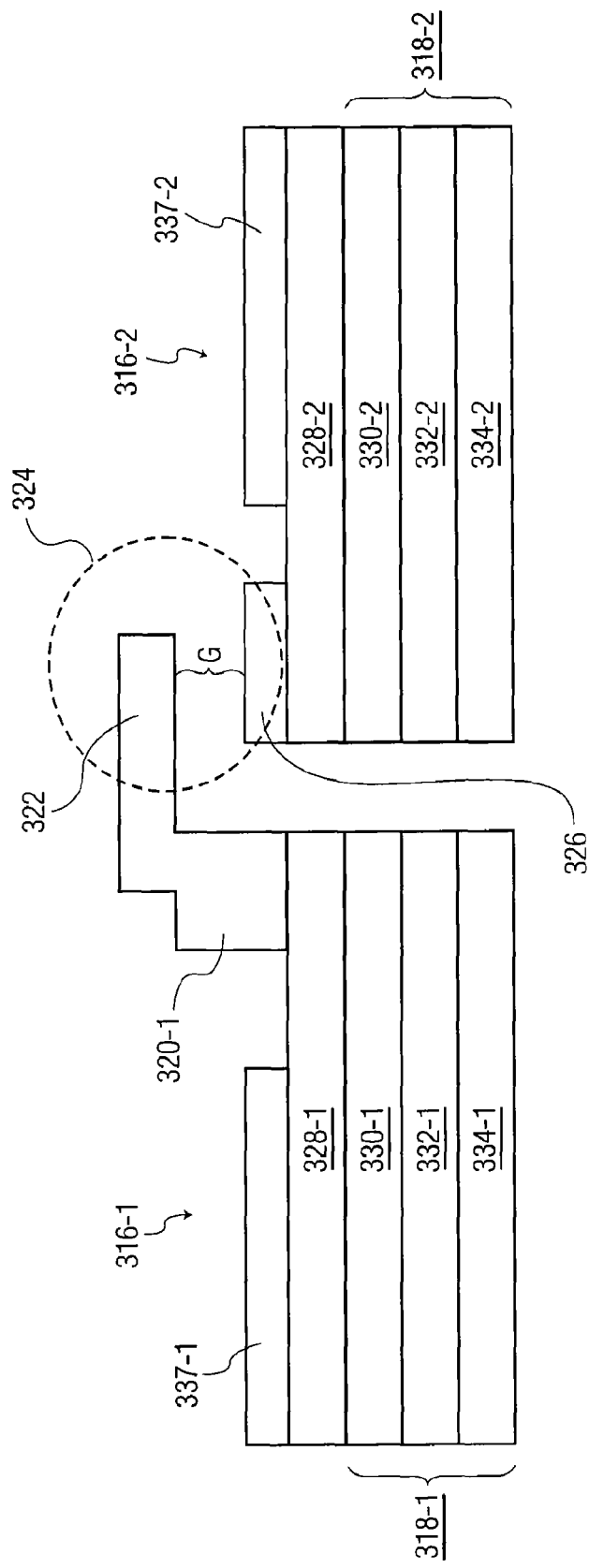
FIG. 3D is a cross-section diagram of the portion of the piezoelectric switch shown FIG. 3B, along lines C, C'.

Referring to FIGS. 3A, 3B, 3C and 3D, exemplary piezoelectric switch 302 is shown coupled to substrate 304. In particular, FIG. 3A is a perspective diagram of piezoelectric switch 302; FIG. 3B is a perspective diagram of a portion of piezoelectric switch 302 in region 305; FIG. 3C is a cross-section diagram of the portion of piezoelectric switch 302, along lines B, B'; and FIG. 3D is a cross-section diagram of the portion of piezoelectric switch 302, along lines C,C'.

Piezoelectric switch 302 is the same as piezoelectric switch 102 (FIG. 1A) except that piezoelectric actuation layer 318 is disposed next to conductor layer 320 (rather than being disposed only below conductor layer 120 (FIG. 1B)). In addition, each cantilever beam actuator 316 includes dual piezoelectric actuation layers 318 with conductor layer 320 positioned therebetween. Accordingly, conductor layer 320 (which carries an RF signal) is further separated from first and second electrodes 330, 334 (which provide an actuation signal to piezoelectric film 332). Piezoelectric switch 302, thus, may reduce a coupling between the RF and actuation signals.

As shown in FIGS. 3A and 3B, input signal contact 310 is coupled to conductor layer 320-1 and output signal contact 312 is coupled to conductor layer 320-2. Control voltage contact 306 is coupled to dual actuation layers 318-1, 318-2 and ground contact 308 is coupled to dual piezoelectric actuation layer 318-1, 318-2. Although one control voltage contact 306 is illustrated, it is understood that different control voltage contacts 306 may be provided to separately control each cantilever beam actuator 316-1, 316-2.

As shown in FIG. 3C, along lines B, B', conductor layer 320-2 of the second cantilever beam actuator 316-2 is disposed above isolation layer 328-2. In addition, further conductor layer 326 is disposed between conductor layer 320-2 and isolation layer 328-2. Conductor layer 320-1 of the first cantilever beam actuator 316 is separated from further conductor layer 326 by nanogap G. In addition, piezoelectric actuation layer 318-2 is disposed below isolation layer 328-2.

Referring to FIG. 3D, along lines C, C', each cantilever beam actuator 316 includes piezoelectric actuation layer 318 disposed below isolation layer 328. Each piezoelectric actuation layer 318 includes piezoelectric layer 332 and first and second electrodes 330, 334. Each cantilever beam also includes top electrode 337 disposed on isolation layer 328 and separated from conductor layer 320. First cantilever beam actuator 316-1 also includes conductor layer 320-1 having projection 322 that overlaps second cantilever beam actuator 316-2 in contact region 324. Second cantilever beam actuator 316-2 includes further conductor layer 326 that is separated from projection 322 by nanogap G. Top electrode 337 may be coupled to ground contact 308, for example, to electrically isolate conductor layer 320 from piezoelectric actuation layer 318.

Similar to piezoelectric switch 102 (FIG. 1A), application of a voltage to first and second electrodes 330, 334 closes piezoelectric switch 302 such that projection 322 is in electrical contact with further conductor layer 326. Because further conductor layer 326 is in contact with conductor layer 320-2, and RF signal from input signal contact 310 is passed along conductor layers 320-1, 320-2 and provided to output signal contact 312. Similarly, by providing a voltage with a reverse polarity to electrodes 330, 334, projection 322 may be electrically isolated from further conductor layer 326, thus opening piezoelectric switch 302.

Figure 4A:
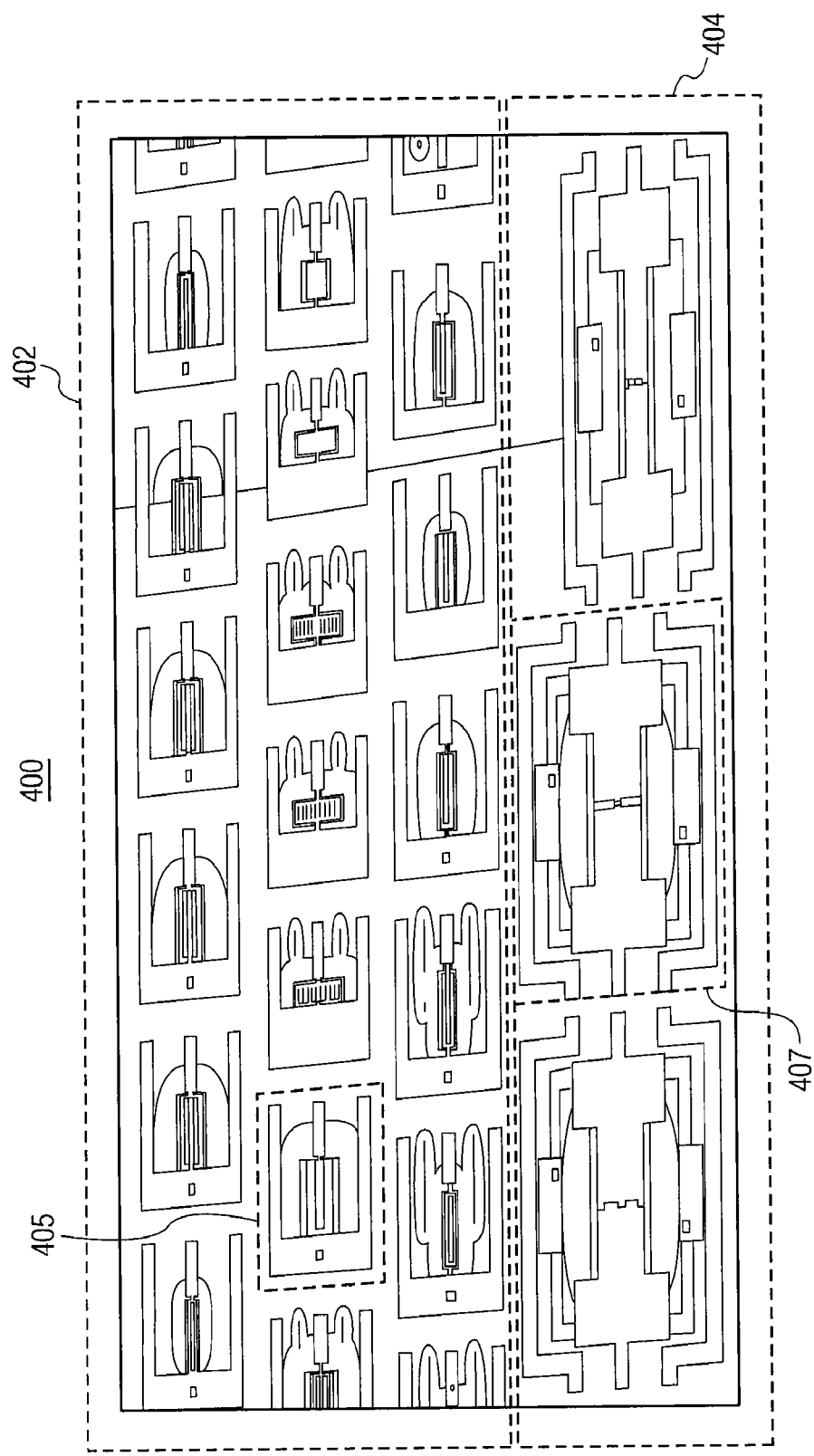
FIG. 4A is an overhead diagram of an exemplary semiconductor chip including contour-mode (CM) piezoelectric transducers and piezoelectric switches, according to an embodiment of present invention.
Figure 4B:
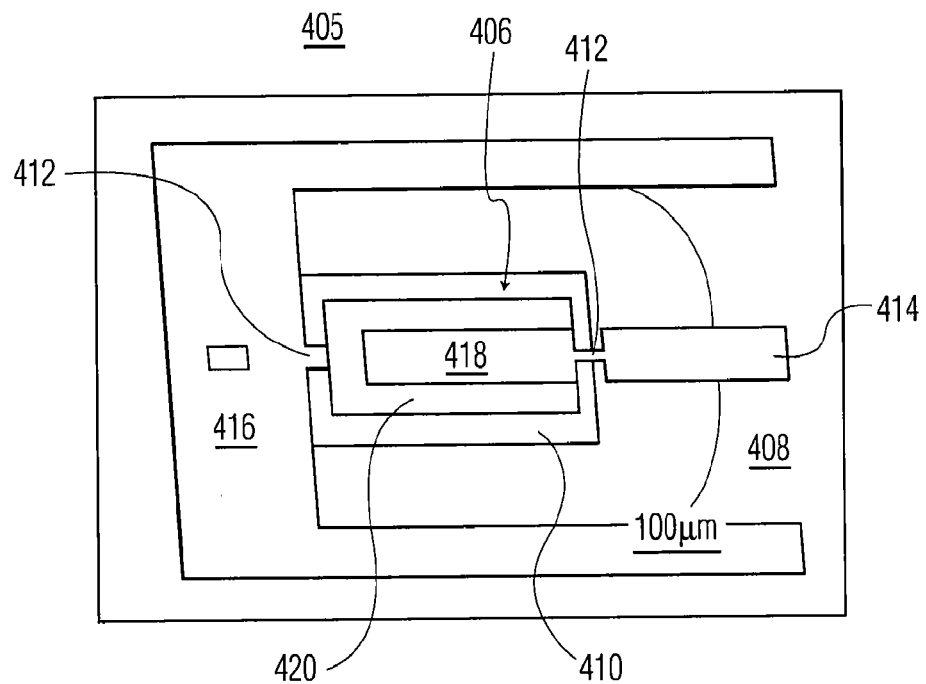
FIG. 4B is a perspective diagram of a CM piezoelectric transducer included in the semiconductor chip shown in FIG. 4A.
Figure 4C:
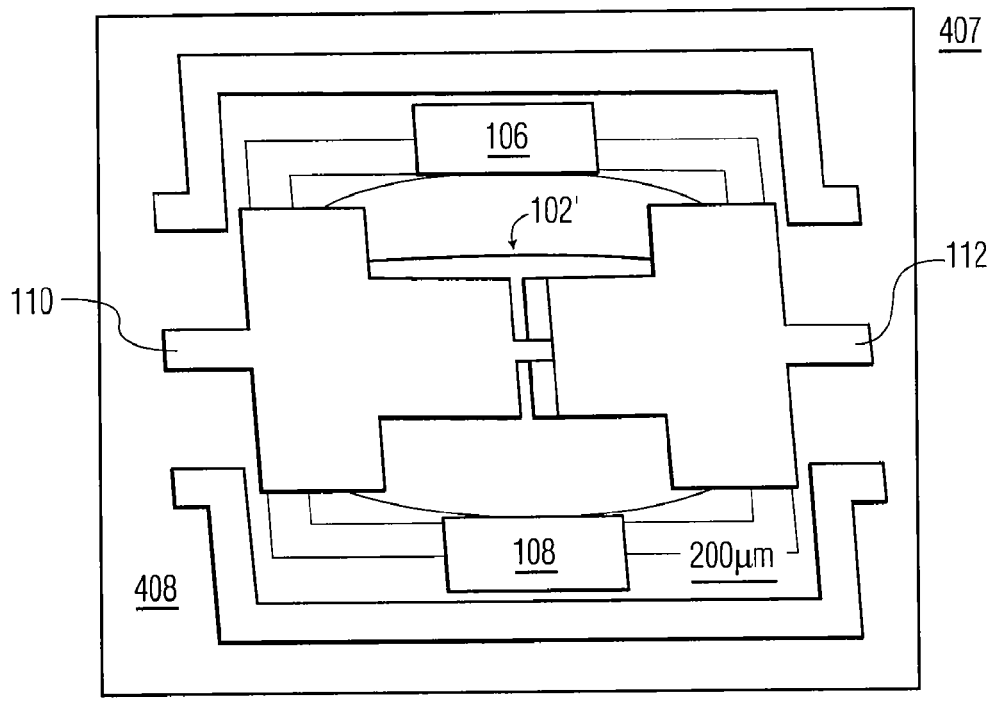
FIG. 4C is a perspective diagram of a piezoelectric switch included in the semiconductor chip shown in FIG. 4A.

Referring next to FIGS. 4A, 4B and 4C, semiconductor chip 400 including transducer region 402 and switch region 404 is shown. Transducer region 402 includes a plurality of CM piezoelectric transducers and switch region 404 includes a plurality of piezoelectric switches. In particular, FIG. 4A is an overhead diagram of semiconductor chip 400; FIG. 4B is a perspective diagram of portion 405 of semiconductor chip 400 illustrating CM piezoelectric transducer 406; and FIG. 4C is a perspective diagram of portion 407 of semiconductor chip 400 illustrating piezoelectric switch 102'.

Referring to FIG. 4B, portion 405 of transducer region 402 illustrates CM piezoelectric transducer 406 suspended from substrate 408. CM piezoelectric transducer 406 include piezoelectric film 420 and top and bottom electrodes 418 (only top electrode 418 is shown). Piezoelectric film 420 is suspended so that it is spaced away from substrate 408. Piezoelectric transducer 406 is tethered to substrate 408 by one or more tethers 412 and is separated from substrate 408 by etched portion 410. Input/output (I/O) contact 414 is coupled to top electrode 418 and ground contact 416 is coupled to bottom electrode 418. Because piezoelectric transducer 406 is suspended from substrate 408, all electrical connections may be provided via tethers 412. A number of tethers 412, thus, may be selected according to a suitable number and/or arrangement of electrical connections to piezoelectric transducer 406.

Although FIG. 4B illustrates that piezoelectric film 420 is rectangular-shaped, it is contemplated that piezoelectric film 420 may be configured into any suitable shape, in order to control a bandwidth and center frequency of CM piezoelectric transducer 406. Examples of piezoelectric film shape include, but are not limited to, a rectangle, a ring, a circle, or any other polygon shape. As described further below with respect to FIGS. 5A-5H, electrodes 418 may be formed from a same material as the electrodes of piezoelectric switch 102'. In addition, in an exemplary embodiment, piezoelectric film 420 of CM piezoelectric transducer 406 is desirably formed from a same material as the piezoelectric film of piezoelectric switch 102.

Referring to FIG. 4C, portion 407 of switch region 404 illustrates piezoelectric switch 102' coupled to substrate 408. Piezoelectric switch 102' is the same as piezoelectric switch 102 (FIG. 1A), except that piezoelectric switch 102' is coupled with CM piezoelectric transducer 406 to substrate 408. Although piezoelectric switch 102' is illustrated in FIG. 4C, it is understood that switch region 404 may include any suitable dual-beam piezoelectric switch, including piezoelectric switch 202 (FIG. 2A) or piezoelectric switch 302 (FIG. 3A). Although not illustrated in FIGS. 4A, 4B and 4C, it is contemplated that piezoelectric switches in switch region 404 and CM piezoelectric transducers in transducer region 402 may be electrically connected on the same substrate 408.

Figure 5A:
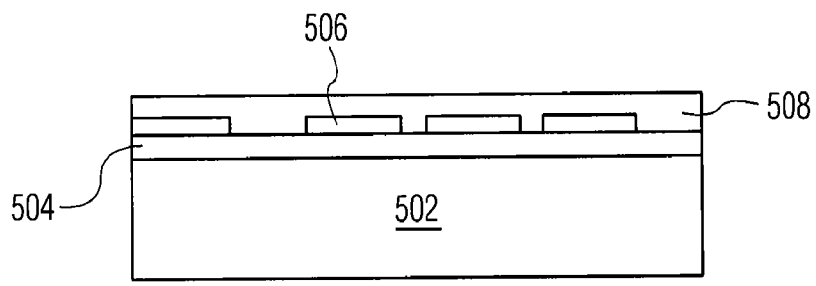
FIGS. 5A, 5B, 5C, 5D, 5E, 5F, 5G and 5H are cross-section diagrams illustrating an exemplary method for forming a semiconductor chip including a piezoelectric switch and a CM piezoelectric transducer, according to an embodiment of the present invention.

Referring to FIGS. 5A-5H, a fabrication process for fabricating an exemplary semiconductor chip 524 is shown. In FIG. 5A, low-stress nitride (LSN) 504 may be deposited on silicon substrate 502 to provide electrical isolation. Bottom metal electrodes 506 are sputter-deposited in a suitable pattern by lift-off. Piezoelectric layer 508 is sputter-deposited on LSN layer 504. Bottom electrodes 506, for example, represent bottom electrodes of piezoelectric transducer 522 and second electrodes of piezoelectric switch 520. In an exemplary embodiment, a 1 μm thick piezoelectric film 508 is deposited on a 300 nm thick layer of LSN 504 and a 200 nm thick layer of electrode 506.

Figure 5B:
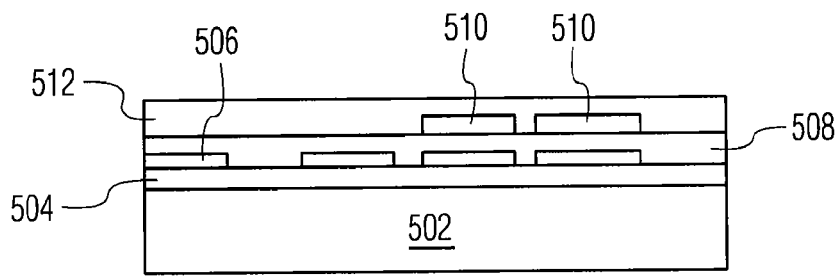

In FIG. 5B, middle electrodes 510 are sputter-deposited on piezoelectric layer 508 in a suitable pattern by lift-off. Middle electrodes 510 are used in a region corresponding to piezoelectric switch 520 and represent first electrodes of piezoelectric switch 520. Isolation layer 512 is sputter-deposited on piezoelectric layer 508. In an exemplary embodiment, a 200 nm thick layer of middle electrode 510 and a 1 μm thick isolation layer 512 is deposited on piezoelectric layer 508. As described above, it is desirable that isolation layer 512 and piezoelectric layer 508 is formed from a same material. Isolation layer 512 represents an isolation layer of piezoelectric switch 520. The combination of isolation layer 512 and piezoelectric layer 508 represent a piezoelectric film for piezoelectric transducer 522.

Figure 5C:
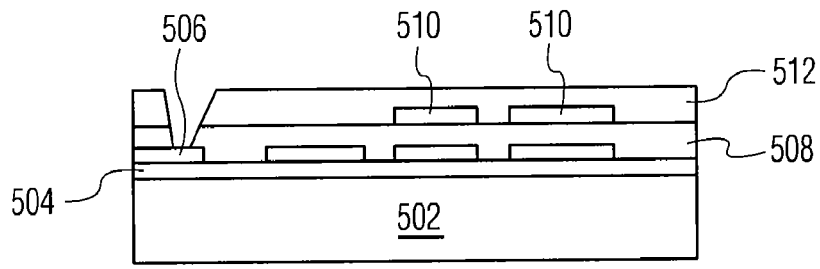
Figure 5D:
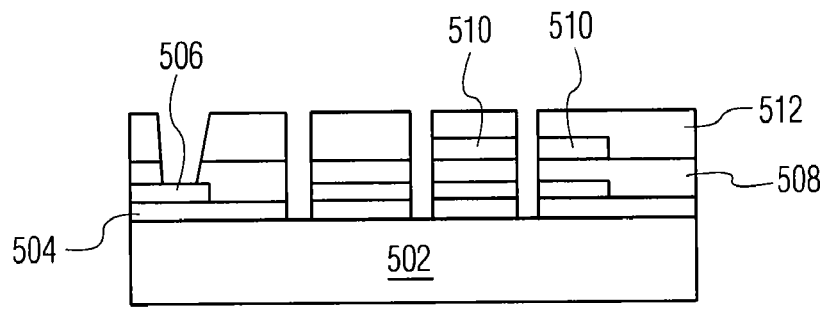

In FIG. 5C, contacts are opened through isolation layer 512 and piezoelectric layer 508 to bottom metal electrodes 506, by a wet etching in a hot (e.g., 70° C.) AZ400k bath. In FIG. 5D, isolation layer 512 and piezoelectric layer 508 are masked using silicon oxide and etched by a chlorine-based dry etching process.

Figure 5E:
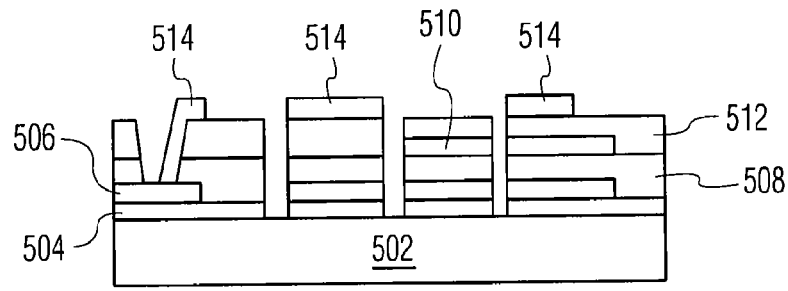

In FIG. 5E, top electrodes 514 are sputter-deposited and patterned by lift-off. For example, top electrodes 514 are used to form a further conductor layer of piezoelectric switch 520 and a top electrode of piezoelectric transducer 522. In an exemplary embodiment, a 200 nm thick layer of top electrode 514 is deposited on isolation layer 512.

Figure 5F:
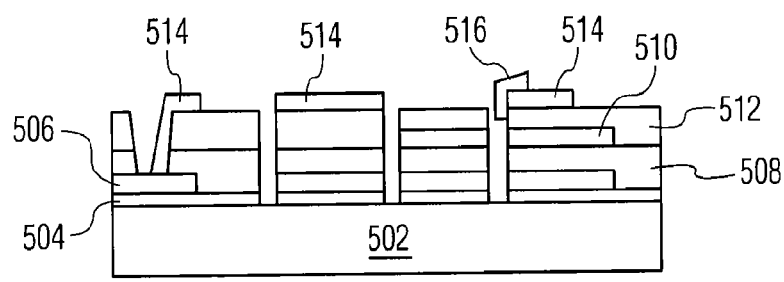
Figure 5G:
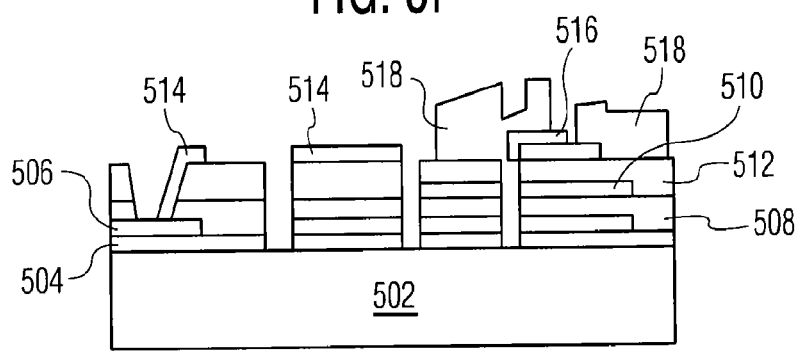

In FIG. 5F, amorphous silicon sacrificial layer 516 is sputter-deposited or evaporated and patterned by lift-off. In FIG. 5G, conductor seed layer 518 is deposited and a photoresist is used to pattern the conductor layer. In an exemplary embodiment, a gold seed layer was used.

Figure 5H:
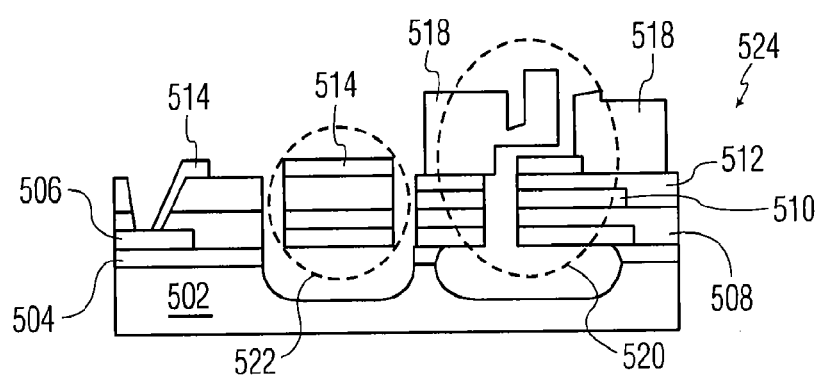

In FIG. 5H, conductor seed layer 518 is wet-etched. In addition, sacrificial layer 516, piezoelectric switch 520 and piezoelectric transducer 522 are released by dry etching from substrate 502 in xenon difluoride ($XeF_2$). Alternatively, the structures may be released by a wet etching process.

Although an LSN layer 504 is illustrated, it is contemplated that layer 504 may be formed from a material including silicon nitride, silicon dioxide, aluminum nitride, silicon carbide, titanium dioxide, polylmide dielectrics, hafnium dioxide, SU-8 photoresist polymer dielectrics, and combinations thereof.

The fabrication process shown in FIGS. 5A-5H is post-CMOS compatible, enabling complete integration of piezoelectric switches 520 and piezoelectric transducers 522 on a same semiconductor chip. Conductor layer 518 serves at least two purposes. One purpose includes functioning as a low resistance carrier for an RF signal. A second purpose includes functioning as a structural layer to offset a neutral axis of a cantilever beam actuator used to produce a bending moment for switch actuation.

Typically, the material or actuation scheme of conventional MEM switches are not compatible with piezoelectric CM piezoelectric transducers. For example, CM piezoelectric transducers typically use aluminum nitride for the piezoelectric film. Conventional MEM switches, in contrast, typically use electrostatic actuation or a material such as PZT that is not compatible with the aluminum nitride piezoelectric film of the CM piezoelectric transducers. In addition, there are design tradeoffs between MEM switches and CM piezoelectric transducers. MEM switches are typically designed to produce a large displacement whereas CM piezoelectric transducers typically are designed to have a high center frequency and a high quality factor.

By developing a piezoelectric switch using a same material as a CM piezoelectric transducer, an integrated RF platform may be produced that includes both piezoelectric switches 520 and contour-mode transducers 522. The fabrication process of the present invention allows for co-fabrication of piezoelectric switches 520 and contour-mode piezoelectric transducers 522 on a same chip while optimizing the performance of each component. By monolithically integrating piezoelectric switches 520 with CM piezoelectric transducers 522 on a single semiconductor chip, a compact, low loss and integrated multi-frequency RF front-end may be produced.

Next, examples of the performance of piezoelectric switch 102 (FIG. 1A) and a CM piezoelectric transducer integrated with piezoelectric switch 102 is described.

Figure 6:
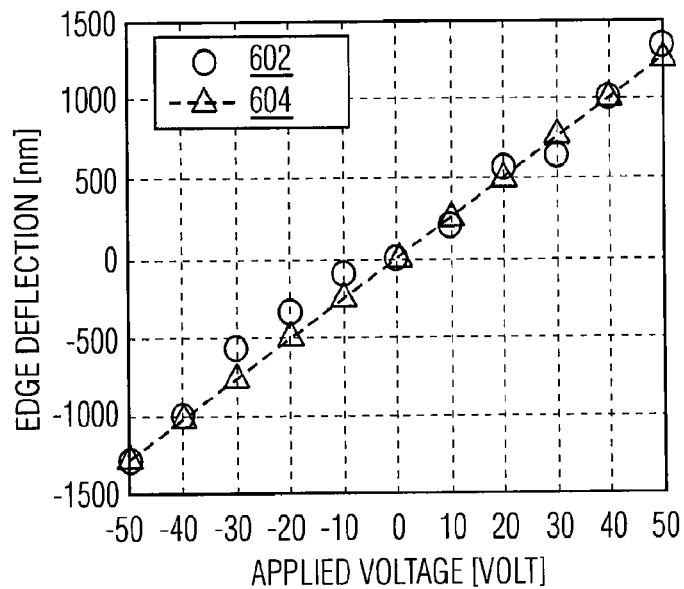
FIG. 6 is a graph of simulated and measured edge deflection as a function of applied voltage for a piezoelectric actuator similar to the switch shown in FIG. 1A.

Referring to FIG. 6, experimental edge deflection 602 and simulated edge deflection 604 are shown as a function of applied voltage for a piezoelectric actuator similar to switch 102 (FIG. 1A). The piezoelectric actuator refers to one of the cantilever beam actuators that form piezoelectric switch 102 (FIG. 1A). The results shown in FIG. 6 are for a piezoelectric actuator that includes a unimorph actuator and is about 300× 100 µm. The experimental edge deflection 602 showed good agreement with simulated edge deflection 604.

In contrast to conventional MEM switches, piezoelectric switch 102 (FIG. 1A) uses a low actuation voltage (for example, about 7 V-20 V) and has a linear switch response. Because exemplary piezoelectric switches use a low actuation voltage and have a linear response, the cantilever beam actuators of piezoelectric switch 102 may provide a force enhancement between the two cantilever beam actuators at the contact region as the actuation voltage is increased.

Figure 7A:
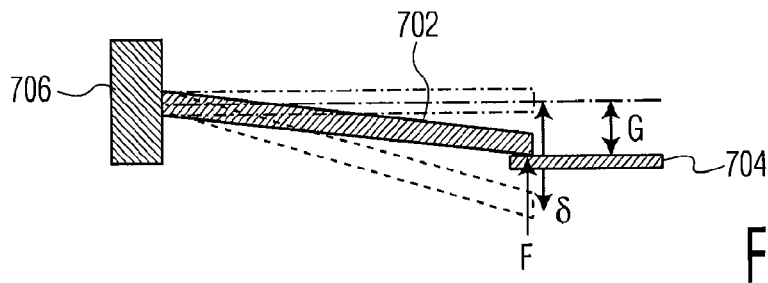
FIG. 7A is a cross-section diagram of dual cantilever beams illustrating determination of an applied force at a contact region for the cantilever beams.
Figure 7B:
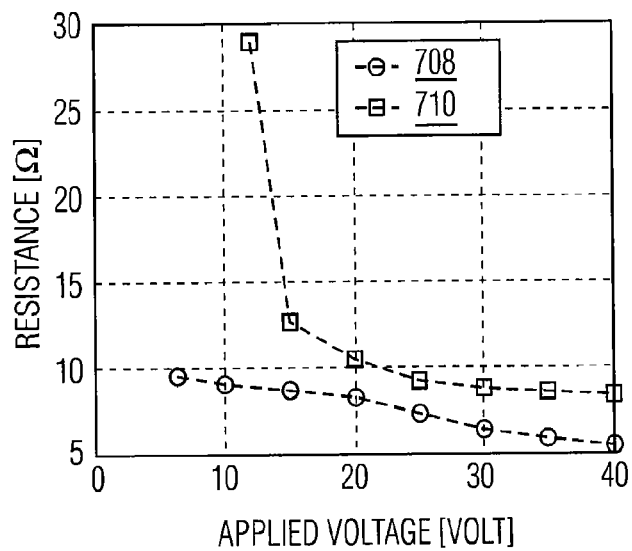
FIG. 7B is a graph of DC contact resistance as a function of applied voltage for the piezoelectric switch shown in FIG. 1A.

An explanation of the force enhancement is provided with respect to FIGS. 7A and 7B. In particular, FIG. 7A is a cross-section diagram of cantilever beams 702 and 704 (only a portion of beam 704 is shown), illustrating determination of an applied force F at a contact region between cantilever beams 702, 704; and FIG. 7B is a graph of DC contact resistance as a function of applied voltage for piezoelectric switch 102 (FIG. 1A). With respect to FIG. 7B, piezoelectric switch 102 (FIG. 1A) of about 200×200 µm is used to generate the DC contact resistance measurements.

FIG. 7A illustrates first beam 702 coupled to support 706. Beam 702 is separated from second beam 704 (the support for beam 704 is not shown) by gap G. In dual-beam piezoelectric actuation, voltage is typically equivalent to a deflection (δ) of each beam 702, 704. The deflection can be considered to be equivalent to force F when first beam 702 contacts second beam 704. In addition, the actuation of second beam 702 is a function of voltage. Thus, increasing the voltage will increase the deflection δ of first beam 702.

If a voltage is applied to beam 702 such that the deflection δ is greater than switch closing gap G, first beam 702 may exert force F on second beam 704 that is proportional to δ-g (i.e., an excess deflection or the deflection that first beam 702 cannot undergo because of the presence of second beam 704). Accordingly, first beam 702 may bend by an increased amount. As a result of the excess bending, a force equivalent to the excess deflection may be applied to second beam 704. Thus, increasing an applied voltage to first beam 702 may lead to an increased excess deflection and an increased contact force between beams 702 and 704.

Referring to FIG. 7B, experimental resistance measurements for piezoelectric switch 102 illustrates that a contact force is higher in case of dual-beam actuation as opposed to single beam actuation. In particular, dual-beam on-resistance 708 (i.e., when both beams are actuated) is less than the single beam on-resistance 710 (i.e., when a single beam is actuate). The results in FIG. 7 implies that force F is higher in case of dual-beam actuation as compared to single-beam actuation.

In FIG. 7B, dual-beam on-resistance 708 illustrates an on-resistance starting from 16.7Ω at 2 V and reaching values as low as 3Ω at 40 V (for dual-beam actuation 708). Both resistances 708, 710 decrease with increased applied voltage, illustrating that higher forces produce lower on-resistance. By using dual-beam actuation, use of two actuators doubles the applied force per unit voltage. When both beams are actuated (i.e., on-resistance 708) a voltage of 6.3 V may be applied to establish contact (as opposed to about 12 V for a single-beam on-resistance 710). In addition, the contact resistance drops to about 5.4Ω at 40 V for dual-beam on-resistance 708 (as compared to about 8.4Ω for a single-beam on-resistance 710).

Another advantage of exemplary piezoelectric switches of the present invention is the use of active pull-off to open and close the piezoelectric switch. One problem typically encountered in conventional switches is that the force used to open the switch is generally structural (for example, the conventional switch accumulates a restoring force when it is pushed into contact and where the restoring force is typically due to an intrinsic stiffness of the structure). This structural force is typically limited and sometimes may not be sufficient to return the switch to its original position once it is open.

By using active pull-off, the polarity of the voltage that is applied to the piezoelectric switch may be reversed (as shown in FIGS. 1B, 1C) and thus actively apply a force to open the piezoelectric switch. By using active pull-off, the opening time of the switch may be decreased, thus providing faster switching times (for example, reducing the switching time by about half). In addition, use of active pull-off may improve the isolation of the cantilever beam actuators (i.e., the off-state impedance of the piezoelectric switch). The active pull-off mechanism may also be used to overcome any adhesion forces acting between contact of the cantilever beams.

Figure 8A:
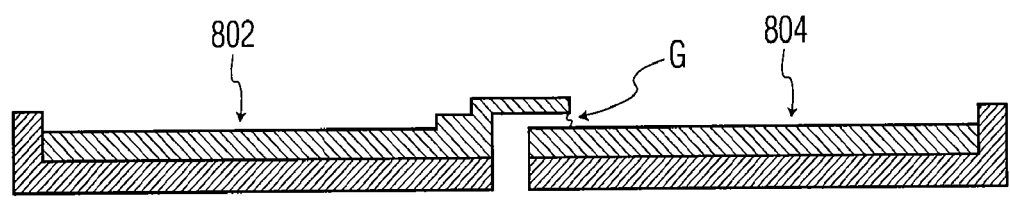
FIGS. 8A, 8B and 8C are cross-section diagrams of a dual cantilever beam switch illustrating residual stress on the unreleased and released cantilever beams and the compensation offered by the dual-beam mechanism.
Figure 8B:
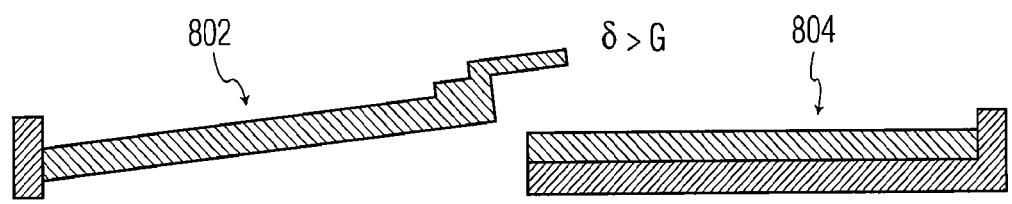

Another advantage of the present invention is that exemplary dual-beam actuated switches may be immune to residual stress and process-induced variation in a size of the initial nanogap. The immunity to residual stress is described further with respect to FIGS. 8A-8C. In particular, FIG. 8A is a cross-section diagram of unreleased first and second actuator beams 802, 804 separated by gap G; FIG. 8B is a cross-section diagram of cantilever beam 802 after release and cantilever beam 804 unreleased; and FIG. 8C is a cross-section diagram of both cantilever beams 802, 804 after release.

Residual stress is typically present in piezoelectric switch due to a difference in thermal expansion coefficients of the materials used and the deposition parameters used for the various materials. It is typically difficult to achieve a switch substantially free of residual stress. Exemplary switches of the present invention minimize the effects of residual stress by simultaneously actuating both cantilever beam actuators so that both beams 802 deflect similarly upon release. As defined herein, immunity to residual stress refers to immunity to a variability in switch closing gap G.

In order to produce switching using a low voltage, gap G is desirably designed with a predetermined height such that it may be controllably closed or opened. When one beam 802 is released (FIG. 8B), a deflection (δ) of first beam 802 may be greater than closing gap G between cantilever beams 802, 804. Because the deflection is greater than the closing gap, active pull-off actuation for one released beam 802 may cause a variability in the height of closing gap G.

Figure 8C:
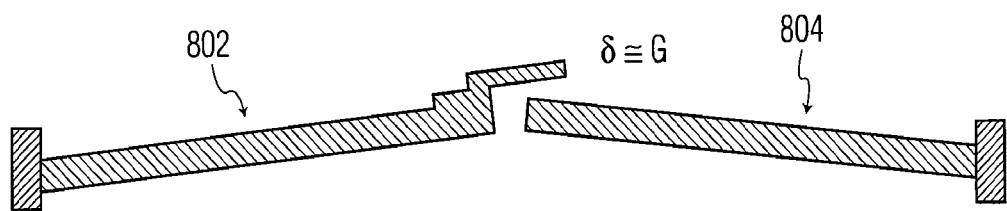

As shown in FIG. 8C, by releasing both beams 802, 804 and using substantially symmetric beams (i.e., both beams 802, 804 used for actuation are symmetric with respect to each other) the deflection δ does not affect the size of the closing gap G. Because deflection δ does not change the closing gap G, exemplary piezoelectric switches of the present invention are not substantially affected by the residual stress. In addition, because both beams 802, 804 are symmetric, each beam 802, 804 deflects similarly upon release. In this manner, gap G may be kept at approximately a same desired height.

Figure 9:
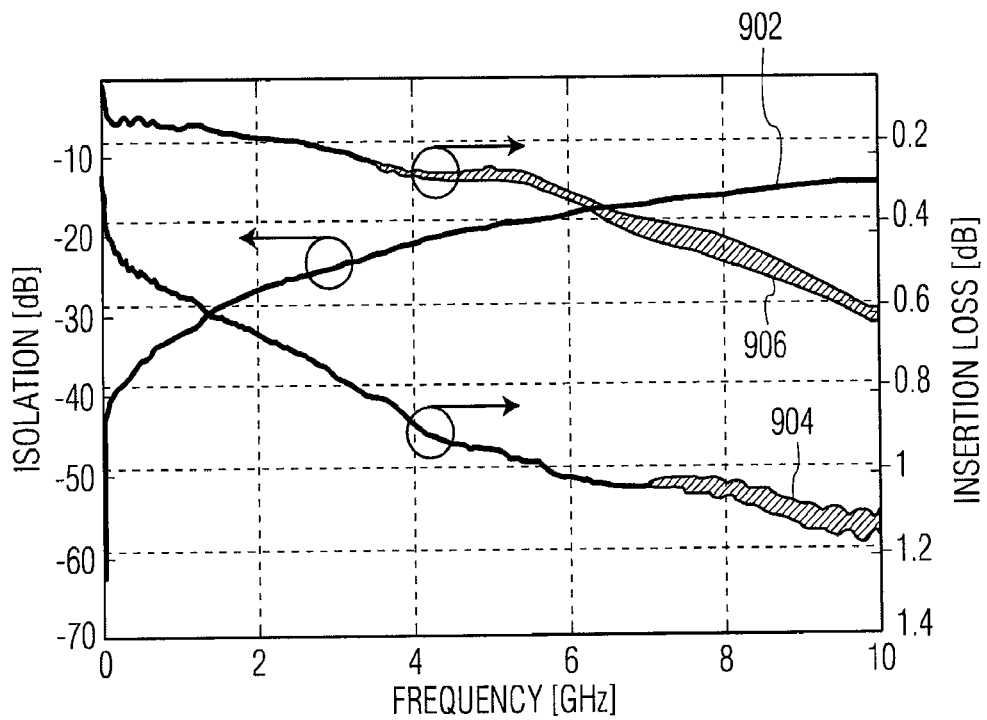
FIG. 9 is a graph of isolation and insertion loss of a function of frequency for the piezoelectric switch shown in FIG. 1A.

Referring to FIG. 9, a graph of isolation 902, insertion loss 904 and through line 906 as a function of frequency are shown for piezoelectric switch 102 (FIG. 1A). With respect to FIG. 9, a piezoelectric switch having a size of about 200×200 µm is used. Isolation 902 of greater than about 21 decibels (dB) and a low return loss of less than about 0.95 dB are obtained at about 4 GHz. An insertion loss 904 of less than about 0.9 dB and a return loss of greater than about 30 dB were obtained at about 4 GHz for the piezoelectric switch. A high insertion loss 904 at 4 GHz may be due to substrate parasitics, which may be illustrated by comparing the switch response to through-line 906. Through-line 906 represents a metal line without the presence of a piezoelectric switch. Because through-line 906 includes a large insertion loss, it is contemplated that substrate parasitics may contribute to the insertion loss 904 of the piezoelectric switch.

Figure 10:
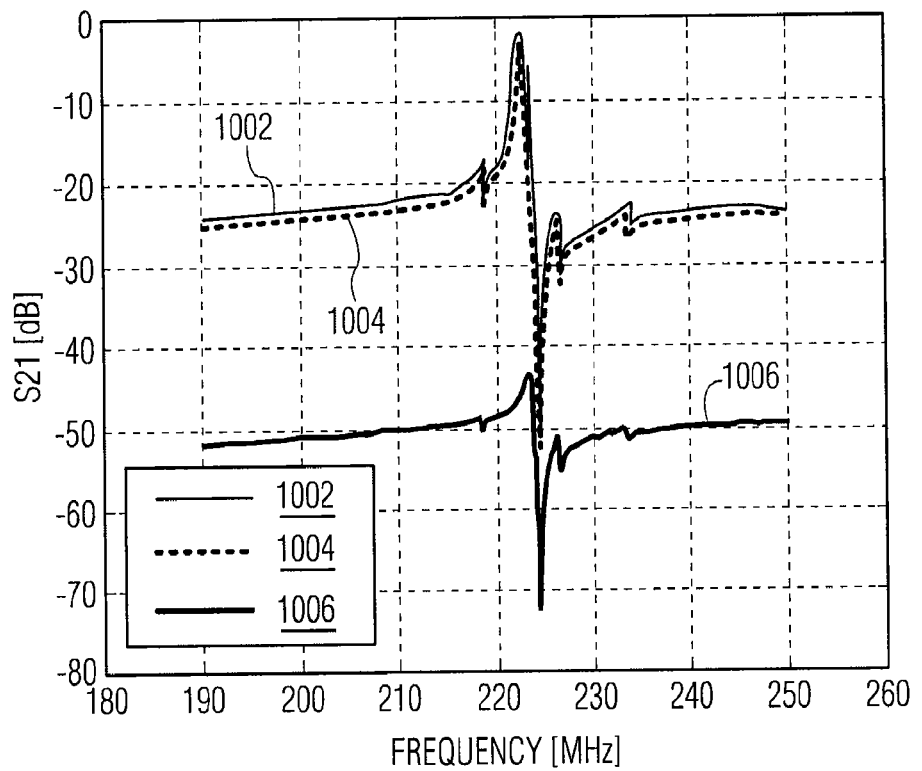
FIG. 10 is a graph of transmission as a function of frequency of a semiconductor chip including a contour-mode transducer monolithically integrated with an exemplary piezoelectric switch.

Referring to FIG. 10, a graph of transmission as a function of frequency is shown for a CM piezoelectric transducer (for example, CM piezoelectric transducer 406 (FIG. 4B)) monolithically integrated with piezoelectric switch (for example, piezoelectric switch 102' (FIG. 4C)). Response S21 1002 represents the transmission response of a CM piezoelectric transducer without integration of the piezoelectric switch. Response S21 1004 represents the combined response (i.e., cascaded S-parameters) of an integrated piezoelectric transducer and piezoelectric switch when the piezoelectric switch is turned on. Response S21 1006 represents the combined response when the piezoelectric switch is turned off. As shown in FIG. 10, response S21 1002 (without integration of piezoelectric switch) substantially overlaps the response S21 1004 (the combined response with piezoelectric switch turned on). Accordingly, the overlap between responses S21 1002 and S21 1004 illustrate that introduction of a piezoelectric switch on a same substrate as piezoelectric transducer does not substantially affect the piezoelectric transducer response.

Figure 11A:
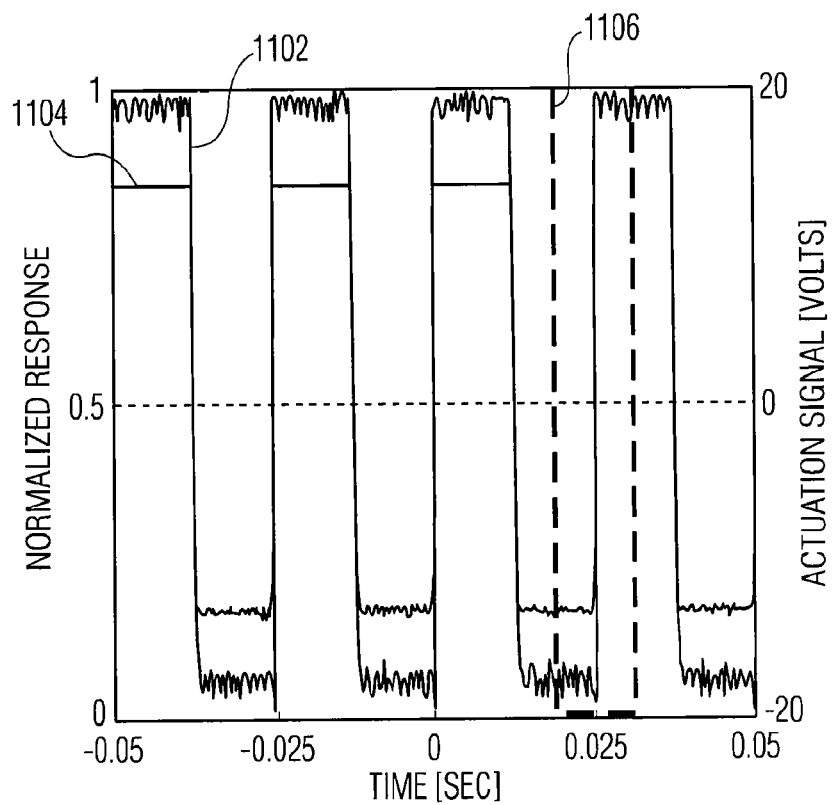
FIG. 11A is a graph of a normalized switch response to an AC test signal as a function of time for the piezoelectric switch shown in FIG. 1A.
Figure 11B:
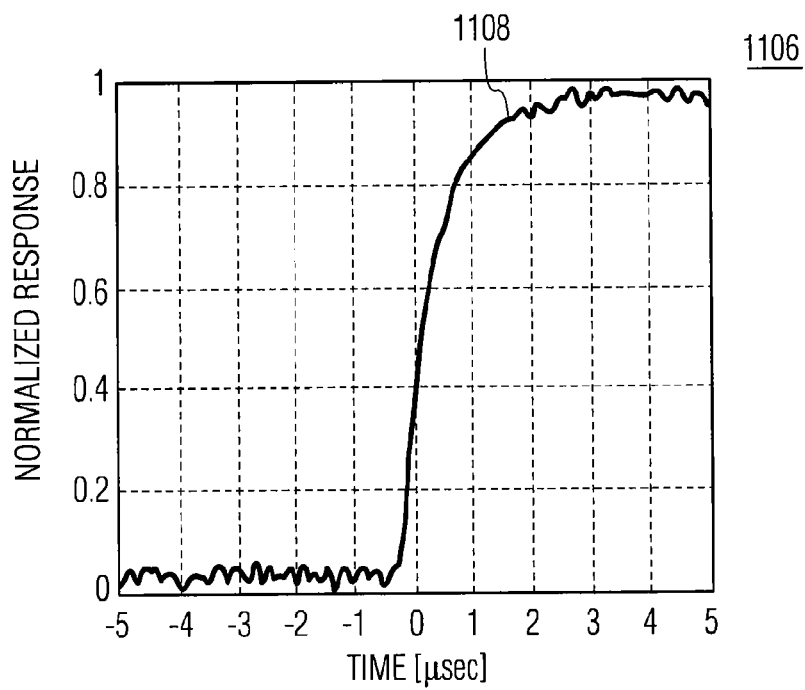
FIG. 11B is a graph of a portion of the normalized switch response shown in FIG. 11A.

Referring to FIGS. 11A and 11B, normalized switch response 1102 and actuation signal 1104 as a function of time are shown. Normalized response 1102 is a response of an exemplary piezoelectric switch to an AC test signal 1104 at 40 Hz. FIG. 11B is a graph of normalized switch response 1108 for portion 1106 of the normalized switch response 1102 shown FIG. 11A. As shown in FIG. 11B, normalized switch response 1108 illustrates a switching time of about 1-2 µs.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A piezoelectric switch comprising:
    a first cantilever beam actuator which includes a first conductive layer which moves with said first cantilever beam actuator;
    a second cantilever beam actuator having a projection that overlaps the first cantilever beam actuator in a contact region, said projection mechanically separated from the first cantilever beam actuator by a nanogap such that the first and second cantilever beam actuators are electrically isolated from each other, said projection includes a second conductive layer;
    wherein each of said first and second cantilever beam actuators includes a respective piezoelectric actuation layer, and
    wherein electrical current flowing through each piezoelectric actuation layer causes said first conductive layer and said second conductive layer to become electrically conductive with each other.

2. The piezoelectric switch according to claim 1, wherein at least one piezoelectric actuation layer including a unimorph or a bimorph actuator.

3. The piezoelectric switch according to claim 1, wherein the nanogap includes multiple nanogaps.

4. The piezoelectric switch according to claim 1, wherein the first cantilever beam actuator is positioned collinear with the second cantilever beam actuator.

5. The piezoelectric switch according to claim 1, wherein the first cantilever beam actuator is positioned at an angle relative to the second cantilever beam actuator.

6. The piezoelectric switch according to claim 1, wherein each piezoelectric actuation layer includes a piezoelectric layer disposed between first and second electrodes.

7. The piezoelectric switch according to claim 6, wherein at least one of the piezoelectric layer is formed from a material including aluminum nitride, zinc oxide, lead zirconate titanate, gallium arsenide, aluminum gallium arsenide or any combination thereof.

8. The piezoelectric switch according to claim 1, wherein at least one of the first and second cantilever beam actuators includes a conductor layer disposed proximate to at least one of the piezoelectric actuation layer.

9. The piezoelectric switch according to claim 8, wherein the conductor layer is disposed on the at least one of the first and second cantilever beam actuators.

10. The piezoelectric switch according to claim 8, wherein the conductor layer is disposed next to the at least one of the first and second cantilever beam actuators.

11. The piezoelectric switch according to claim 8, further comprising an isolation layer disposed between the conductor layer and at least one of the piezoelectric actuation layer.

12. The piezoelectric switch according to claim 11, wherein the isolation layer is formed from a piezoelectric material.

13. The piezoelectric switch according to claim 8, wherein the second cantilever beam actuator includes the conductor layer and said conductor layer forms the projection.

14. The piezoelectric switch according to claim 13, including a further conductor layer formed on a portion of the first cantilever beam actuator in a vicinity of the contact region.

15. A semiconductor chip comprising:
    the piezoelectric switch according to claim 1, the piezoelectric switch being coupled to a substrate; and
    at least one contour-mode (CM) piezoelectric transducer comprising:
        a piezoelectric film being suspended so that it is spaced away from the substrate, and
        first and second electrodes disposed on opposite surfaces of said piezoelectric film.

16. A method of forming a piezoelectric switch, the method comprising:
    forming a first cantilever beam actuator; and
    forming a first conductive layer which moves with said first cantilever beam actuator;
    forming a second cantilever beam actuator having a projection that overlaps the first cantilever beam actuator in a contact region, including forming the projection to be mechanically separated from the first cantilever beam actuator by a nanogap such that the first and second cantilever beam actuators are electrically isolated from each other, said projection includes a second conductive layer;

wherein each of the first and second cantilever beam actuators are formed with respective piezoelectric actuation layer, and wherein electrical current flowing through each piezoelectric actuation layer causes said first conductive layer and said second conductive layer to become electrically conductive with each other.

17. The method according to claim 16, forming the piezoelectric actuation layer includes:
    forming a piezoelectric layer; and
    forming first and second electrodes on opposite surfaces of the piezoelectric layer.

18. The method according to claim 16, including applying a common actuation signal to each of the first and second cantilever beam actuators via the respective piezoelectric actuation layer.

19. The method according to claim 16, including applying different actuation signals to the first and second cantilever beam actuators via the respective piezoelectric actuation layer.

20. The method according to claim 16, including:
    applying a first actuation signal to the piezoelectric actuation layer of each of the first and second cantilever beam actuators to open the piezoelectric switch; and
    applying a second actuation signal to the piezoelectric actuation layer of each of the first and second cantilever beam actuators to close the piezoelectric switch, the second actuation signal having an opposite polarity from the first actuation signal.

21. The method according to claim 16, including forming a conductor layer proximate to the piezoelectric actuation layer for at least one of the first and second cantilever beam actuators.

22. The method according to claim 21, including forming the conductor layer on the at least one of the first and second cantilever beam actuators.

23. The method according to claim 21, including forming the conductor layer next to the at least one of the first and second cantilever beam actuators.

24. The method according to claim 21, including forming an isolation layer between the conductor layer and the piezoelectric actuation layer to electrically isolate the conductor layer from at least one of the piezoelectric actuation layer.

25. The method according to claim 21, forming a further conductor layer on a portion of one of the cantilever beam actuators in a vicinity of the contact region.

26. The method according to claim 21, including forming the piezoelectric switch coupled to a substrate of a semiconductor chip,
    wherein the semiconductor chip includes at least one contour-mode piezoelectric transducer.

* * * * *